(12) United States Patent
Okubo et al.

(10) Patent No.: US 9,437,405 B2
(45) Date of Patent: Sep. 6, 2016

(54) HOT ROLLED PLATE MADE OF COPPER ALLOY USED FOR A SPUTTERING TARGET AND SPUTTERING TARGET

(71) Applicant: MITSUBISHI MATERIALS CORPORATION, Tokyo (JP)

(72) Inventors: Kiyoyuki Okubo, Tokyo (JP); Masato Koide, Kagawa-gun (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/654,210

(22) PCT Filed: Dec. 3, 2013

(86) PCT No.: PCT/JP2013/082439
§ 371 (c)(1),
(2) Date: Jun. 19, 2015

(87) PCT Pub. No.: WO2014/103626
PCT Pub. Date: Jul. 3, 2014

(65) Prior Publication Data
US 2015/0318153 A1    Nov. 5, 2015

(30) Foreign Application Priority Data
Dec. 28, 2012   (JP) .................. 2012-288705

(51) Int. Cl.
| C23C 14/34 | (2006.01) |
| H01J 37/34 | (2006.01) |
| B21B 3/00 | (2006.01) |
| C22C 9/00 | (2006.01) |
| C22C 9/01 | (2006.01) |

(Continued)

(52) U.S. Cl.
CPC .............. *H01J 37/3429* (2013.01); *B21B 3/00* (2013.01); *C22C 9/00* (2013.01); *C22C 9/01* (2013.01); *C22C 9/05* (2013.01); *C22F 1/08* (2013.01); *C23C 14/3414* (2013.01); *B22D 11/00* (2013.01)

(58) Field of Classification Search
CPC ............. B21B 3/00; C22C 9/00; C22C 9/01; C22C 9/05; C22F 1/08; C23C 14/3414; H01J 37/3429
USPC ................... 204/298.13, 298.12; 420/494
See application file for complete search history.

(56) References Cited

U.S. PATENT DOCUMENTS

| 2011/0139615 A1 | 6/2011 | Tatsumi et al. |
| 2011/0192719 A1 | 8/2011 | Maki et al. |

FOREIGN PATENT DOCUMENTS

| JP | 62-158841 A | 7/1987 |
| JP | 05-311424 A | 11/1993 |

(Continued)

OTHER PUBLICATIONS

Notice of Allowance mailed Oct. 20, 2015 for the corresponding Japanese Application No. 2012-288705.

(Continued)

*Primary Examiner* — Rodney McDonald
(74) *Attorney, Agent, or Firm* — Leason Ellis LLP

(57) ABSTRACT

Disclosed is a hot rolled plate produced by hot rolling an ingot cast by continuous casting, in which the plate is made of a copper alloy containing 0.5 to 10.0 at % of Ca and the balance consisting of Cu and inevitable impurities and the average grain size of Cu-α phase crystal grains is 5 to 60 μm in a Cu matrix.

8 Claims, 2 Drawing Sheets

(51) Int. Cl.
  *C22C 9/05*    (2006.01)
  *C22F 1/08*    (2006.01)
  *B22D 11/00*   (2006.01)

(56) References Cited

FOREIGN PATENT DOCUMENTS

| | | |
|---|---|---|
| JP | 11-158614 A | 6/1999 |
| JP | 2008-506040 A | 2/2008 |
| JP | 2009-215613 A | 9/2009 |
| JP | 2010-103331 A | 5/2010 |
| JP | 2011-66157 A | 3/2011 |
| JP | 2011-127160 A | 6/2011 |
| JP | 2013-014808 A | 1/2013 |
| JP | 2013-253309 A | 12/2013 |
| TW | 505705 B | 10/2002 |
| TW | 201034200 A | 9/2010 |
| WO | WO-2010/047105 A | 4/2010 |
| WO | WO-2011/078188 A | 6/2011 |

OTHER PUBLICATIONS

Office Action mailed Jan. 11, 2016 for the corresponding Taiwanese Application No. 102146641.
International Search Report mailed Jan. 14, 2014 for the corresponding PCT Application No. PCT/JP2013/082439.

HOT ROLLED PLATE MADE OF COPPER ALLOY USED FOR A SPUTTERING TARGET AND SPUTTERING TARGET

CROSS-REFERENCE TO RELATED PATENT APPLICATIONS

This application is a U.S. National Phase Application under 35 U.S.C. §371 of International Patent Application No. PCT/JP2013/082439, filed Dec. 3, 2013, and claims the benefit of Japanese Patent Application No. 2012-288705, filed Dec. 28, 2012, all of which are incorporated by reference in their entirety herein. The International Application was published in Japanese on Jul. 3, 2014 as International Publication No. WO/2014/103626 under PCT Article 21(2).

FIELD OF THE INVENTION

The present invention relates to a sputtering target made of copper alloy that is used as a target during sputtering when, for example, a copper alloy film is formed on a substrate made of glass, amorphous Si, silica, or the like through sputtering as a wiring film for gate electrodes, source electrodes, drain electrodes, and the like in thin film transistors and a hot rolled plate that is used for the sputtering target and, particularly, to a sputtering target and a hot rolled plate made of a Cu—Ca-based alloy (Ca-containing copper alloy).

BACKGROUND OF THE INVENTION

It is well known that flat panel displays such as liquid crystal displays and organic EL displays have a structure in which a thin film transistor (hereinafter, referred to as "TFT") is formed on a glass substrate or the like. Meanwhile, in response to the recent requirement of an increase in the size and definition of thin televisions, there has been a demand for large and high-definition display panels using the above-described TFT (TFT panels).

In the related art, it was common to use a wiring film made of an aluminum (Al)-based material as the wiring film for gate electrodes, source electrodes, drain electrodes, and the like in the large and high-definition TFT panels; however, in recent years, in order to decrease the resistance of the wiring film, there have been attempts to use a copper (Cu)-based material having a higher conductivity than Al.

While there have been many proposals regarding a variety of copper alloys as the copper-based material intended to be used as the wiring film in the TFT panel, in recent years, as described in, for example, PTL 1 and 2, Cu—Ca alloys have been drawing attention. A wiring film made of a Cu—Ca alloy does not only have a lower resistivity than an Al-based material but also has excellent adhesiveness to glass or the like which is a substrate. In a case in which the wiring film in the TFT panel is formed of the above-described Cu—Ca alloy, it is common to apply sputtering and, in this case, a sputtering target made of the Cu—Ca alloy is used.

CITATION LIST

Patent Literature

[PTL 1] Japanese Unexamined Patent Application, First Publication No. 2009-215613

[PTL 2] Japanese Unexamined Patent Application, First Publication No. 2010-103331

Technical Problem

When sputtering is carried out using a target made of the Cu—Ca alloy which is described in PTL 1 or 2, there are cases in which abnormal electrical discharge (arcing) occurs and thus, in some cases, a uniform wiring film cannot be formed. Here, the abnormal electrical discharge refers to a phenomenon in which a much higher current than that during normal sputtering flows suddenly and drastically, and an abnormally great electrical discharge occurs abruptly. When the above-described abnormal electrical discharge occurs, there is a concern that particles may be generated or the film thickness of a deposited film may be uneven. Therefore, during sputtering, it is desirable to avoid the abnormal electrical discharge as much as possible. However, in PTL 1 and 2, there is no specific disclosure regarding the occurrence of the above-described abnormal electrical discharge.

In PTL 1 and 2, it is described that, when a sputtering target made of a Cu—Ca-based alloy to which Ca is added is manufactured, a molten alloy is cast in a carbon casting mold, the cast alloy is hot rolled and then, finally, strain-relief annealed, and the surface of the obtained rolled body is turned. For the sputtering target obtained in the above-described manner, it is necessary to reliably and stably prevent the occurrence of abnormal electrical discharge during sputtering.

That is, according to experiments by the present inventors and the like, it has been clarified that, in a case in which the crystal grain size of a Cu-α phase is large in a Cu matrix of a Cu—Ca-based alloy that constitutes the sputtering target, abnormal electrical discharge is likely to occur. However, in PTL 1 and 2, the crystal grain size of the Cu-α phase in the Cu matrix is not taken care of and, furthermore, a method in which the molten alloy is cast in a carbon casting mold is applied as the casting method for the sputtering target of PTL 1 and 2 and thus the crystal grain size of the Cu-α phase is likely to be large, which can be considered to act as a cause for the occurrence of abnormal electrical discharge during sputtering.

The present invention has been made in consideration of the above-described circumstances and an object of the present invention is to provide a hot rolled plate used for a sputtering target which is capable of limiting the frequent occurrence of abnormal electrical discharge during sputtering in a case in which a Cu—Ca-based alloy in which Ca is mainly added as an alloy element with respect to Cu such as a Cu—Ca alloy is used as a sputtering target and a sputtering target made of the hot rolled plate.

SUMMARY OF THE INVENTION

Solution to Problem

As a result of inspections and studies conducted by the present inventors and the like, it has been clarified that, as a cause of the occasional occurrence of abnormal electrical discharge when sputtering is carried out using a target made of a Cu—Ca-based alloy, the grain sizes of Cu-α phase crystal grains in a Cu matrix of a Cu—Ca-based alloy which is a target have a great influence on the occurrence of abnormal electrical discharge. That is, when the grain sizes of the Cu-α phase crystal grains are large in the Cu matrix, abnormal electrical discharge is likely to occur. Therefore, in order to prevent the occurrence of abnormal electrical discharge, it is desirable to decrease the sizes of the Cu-α phase crystal grains in the Cu matrix of the sputtering target.

As a method for decreasing the crystal grain size of the Cu-α phase, addition of an appropriate process and heat treatment such as cold working or stain-relief annealing after hot rolling can be considered, but the Cu—Ca-based alloy has poor cold workability due to relatively brittle Cu—Ca-based crystals and thus it is difficult to apply the above-described method to the manufacturing of sputtering targets on an actual mass production scale.

Meanwhile, the present inventors and the like found that the sizes of the Cu-α phase crystal grains in the Cu matrix of the sputtering target have a relationship with the solidification rate of the Cu—Ca-based alloy during casting and crystals that crystallize in an ingot.

That is, when the solidification rate of the Cu—Ca-based alloy during casting is low, the microstructure of the ingot is large, there is a tendency that the crystal structure coarsens even in the recrystallized structure of the ingot obtained through hot rolling, and the grain sizes of the Cu-α phase crystal grains increase in the Cu matrix of the obtained hot rolled plate.

Furthermore, the solidification rate of the Cu—Ca-based alloy during casting also has a relationship with the sizes of crystals that crystallize during casting and thus, when the solidification rate is low, there is a tendency that the sizes of crystals also increase. In this case, as described below, the grain sizes of the Cu-α phase crystal grains increase in the Cu matrix of the hot rolled plate through recrystallization behaviors during hot rolling.

In the Cu—Ca-based alloy, since Ca can rarely form solid solutions in the Cu matrix, the majority of Ca crystallizes in the ingot as Cu—Ca-based crystals represented by $Cu_5Ca$ during melting and casting. The sizes of these crystals are affected by the solidification rate during casting and thus it is common that the crystals become larger as the solidification rate becomes slower. Therefore, when the solidification rate during casting is not appropriately controlled, a number of coarse crystals crystallize in the ingot structure. In a case in which crystals that crystallize in the ingot are coarse as described above, the dispersion density of the crystals becomes small. Meanwhile, crystals hinder the growth of recrystallized grains during recrystallization in a hot rolling step after casting; however, in a case in which the dispersion density of the crystals is small, the above-described effect of the crystals is not sufficiently exhibited and recrystallized grains are likely to coarsen.

Meanwhile, sputtering proceeds as atoms are ejected from the target surface due to ions of a sputtering gas such as Ar and the atoms are deposited on a subject base material and, in this process, the surface of the target gradually retracts. In a case in which sputtering is carried out using a target made of the Cu—Ca-based alloy, since Cu-α phase crystal grains in the Cu matrix which are exposed on the target surface have different crystal orientations for individual neighboring crystal grains, it is common that the ejection rates of the atoms differ for the individual neighboring crystal grains and thus the sputtering rate of the target surface also differs for the individual neighboring crystal grains. Therefore, when the Cu-α phase crystal grains are coarse in the Cu matrix, the difference in the above-described sputtering rate causes the target surface to be uneven among the neighboring crystal grains. In addition, when the target surface becomes significantly uneven during the progression of sputtering in the above-described manner, a current concentrates in protruding portions of the target surface and thus abnormal electrical discharge is likely to be caused.

Meanwhile, the present inventors and the like found that, when continuous casting is applied, it is possible to make the cast structure of the Cu—Ca-based alloy finer by increasing the solidification rate during casting and decrease the grain sizes of Cu—Ca-based crystals in the ingot at the same time and, consequently, it becomes possible to decrease the grain sizes of the Cu-α phase crystal grains in the Cu matrix of the hot rolled plate. Furthermore, in this case, as a result of thorough inspections and studies regarding the influence of the Cu-α phase crystal grains in the Cu matrix of the Cu—Ca-based alloy in a target material on the occurrence frequency of abnormal electrical discharge in a case in which sputtering is carried out using a target made of the Cu—Ca-based alloy, it was found that the occurrence of abnormal electrical discharge can be reliably and stably limited by restricting the average grain size of the Cu-α phase crystal grains to 5 to 60 μm and the present invention was completed.

Therefore, according to a basic aspect (first aspect) of the present invention, a hot rolled plate made of copper alloy used for a sputtering target is hot rolled plate being produced by hot rolling an ingot cast by continuous casting, in which the plate is made of a copper alloy containing 0.5 to 10.0 at % of Ca and the balance consisting of Cu and inevitable impurities, and an average grain size of Cu-α phase crystal grains is 5 to 60 μm in a Cu matrix. Meanwhile, in the present specification, the continuous casting includes both semi-continuous casting and complete continuous casting.

According to the above-described basic aspect of the present invention, since the average grain size of the Cu-α phase crystal grains is restricted to 5 to 60 μm in the Cu matrix in the hot rolled plate made of copper alloy used for a sputtering target, it is possible to limit the frequent occurrence of abnormal electrical discharge during sputtering in which a sputtering target produced from the hot rolled plate is used. In addition, since the target material is cast by applying continuous casting, it becomes possible to increase the solidification rate during casting, consequently, it is possible to make an ingot structure finer and miniaturize Cu—Ca-based crystals in the ingot, and, accordingly, recrystallized grains are made finer in a hot rolling step and it is possible to miniaturize the Cu-α phase crystal grains in the Cu matrix of the hot rolled plate as described above so as to have an average grain size of 5 to 60 μm. Furthermore, since the target material is cast by applying continuous casting, it is possible to manufacture the target material with high productivity.

Furthermore, a hot rolled plate made of copper alloy used for a sputtering target according to a second aspect of the present invention is the hot rolled plate made of copper alloy used for a sputtering target according to the first aspect, in which the amount of Ca in the copper alloy is 0.5 to 6.0 at %.

A hot rolled plate made of copper alloy used for a sputtering target having an amount of Ca in a range of 0.5 to 6.0 at % as described above can be produced with higher productivity by applying continuous casting as a casting method for producing it.

In addition, a hot rolled plate made of copper alloy used for a sputtering target according to a third aspect of the present invention is the hot rolled plate made of copper alloy used for a sputtering target according to the first or second aspects, in which the copper alloy further contains a total of 10.0 at % or less of one or more selected from 0.1 to 5.0 at % of Mg, 0.1 to 5.0 at % of Mn, 0.1 to 5.0 at % of Al, and 0.001 to 0.1 at % of P.

In the above-described hot rolled plate made of copper alloy used for a sputtering target according to the third aspect, it is possible to further improve performance such as adhesiveness of a wiring film that is formed on a substrate through sputtering using the target.

Furthermore, a sputtering target of the present invention is made of the hot rolled plate made of copper alloy used for a sputtering target according to any one of the first to third aspects.

Advantageous Effects of Invention

According to the hot rolled plate made of copper alloy used for a sputtering target of the present invention or the sputtering target for which the hot rolled plate is used, when a wiring film made of a Cu—Ca-based alloy is formed on a substrate using the above-described hot rolled plate or sputtering target by carrying out sputtering, the occurrence of abnormal electrical discharge can be limited during sputtering and, consequently, it becomes possible to form a wiring film which has a low resistivity and stable and excellent adhesiveness to substrates by preventing particles from being generated due to abnormal electrical discharge or preventing the film thickness of the wiring film from becoming uneven in advance.

DETAILED DESCRIPTION OF THE INVENTION

Figure 1:
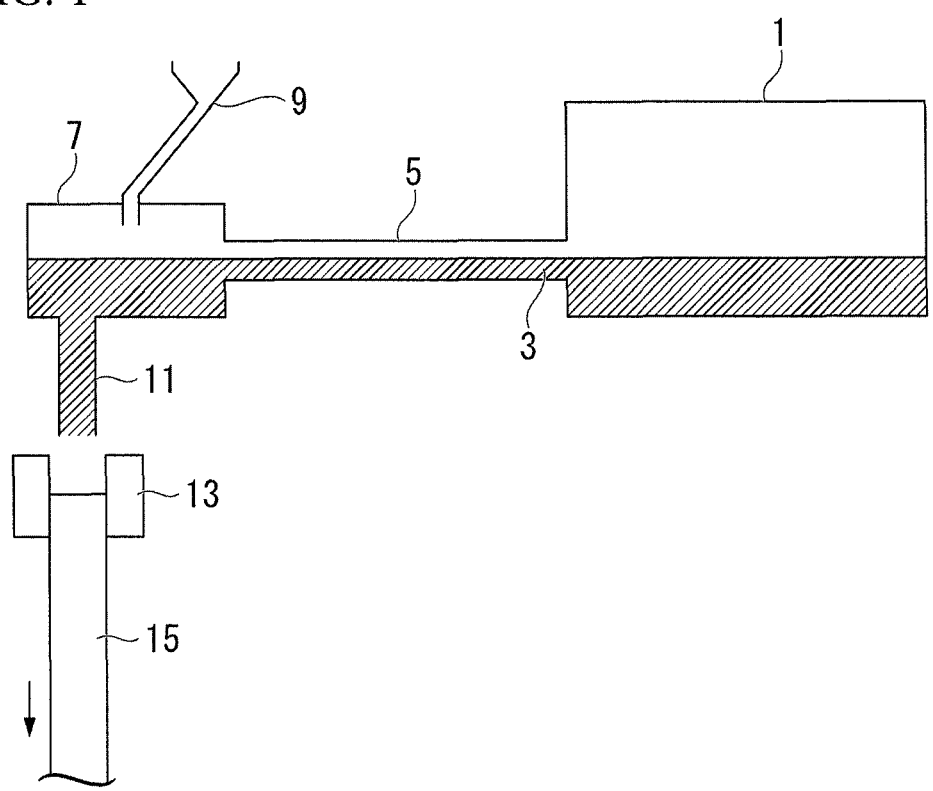
FIG. 1 is a schematically exploded view showing the outline of continuous casting in a case in which the continuous casting is applied to casting of a Cu—Ca-based alloy material in a producing process of a hot rolled plate made of copper alloy used for a sputtering target of the present invention.

Hereinafter, a hot rolled plate made of copper alloy used for a sputtering target of the present invention and a sputtering target for which the hot rolled plate is used will be described in more detail.

The hot rolled plate made of copper alloy used for a sputtering target of the present invention is made of a copper alloy containing, as a component composition, basically, 0.5 to 10.0 at % of Ca and the balance consisting of Cu and inevitable impurities or is made of a copper alloy further containing a total of 10.0 at % or less of one or more selected from 0.1 to 5.0 at % of Mg, 0.1 to 5.0 at % of Mn, 0.1 to 5.0 at % of Al, and 0.001 to 0.1 at % of P as necessary.

Here, first of all, the reasons for limiting the component composition of the copper alloy as described above will be described.

Ca 0.5 to 10.0 at %:

Ca is a basic alloy element of a Cu—Ca-based copper alloy which is considered to be a target in the present invention. A Cu—Ca-based copper alloy film obtained using a Cu—Ca-based copper alloy as a sputtering target for TFT wiring does not only exhibit a characteristic of a low resistivity as a wiring layer but also has excellent adhesiveness to substrates made of glass, Si, silica, or the like. Furthermore, the Cu—Ca-based copper alloy film is capable of reducing the cost by making a foundation layer made of Mo, Ti, or the like, which is expensive, unnecessary depending on the sputtering conditions and the like and is capable of preventing the adhesiveness of the wiring film from being degraded by a variety of heat treatments that are generally applied in a TFT production process. Therefore, in the present invention, a hot rolled plate made of a Cu—Ca-based alloy containing Ca is used as a material of a sputtering target which is used to form the above-described Cu—Ca-based copper alloy film on a substrate through sputtering.

When the Cu—Ca-based alloy contains less than 0.5 at % of Ca, the amount of Ca in the Cu—Ca-based alloy film formed on a substrate through sputtering becomes excessively small and thus the above-described effects cannot be obtained. On the other hand, when the Cu—Ca-based alloy contains more than 10.0 at % of Ca, casting properties become poor in continuous casting (including complete continuous casting and semi-continuous casting described below). Specifically, the strength of an initial solidified shell formed immediately after solidification becomes low and thus there is a concern that the initial solidified shell may be cracked and casting may become difficult. In addition, when the amount of Ca exceeds 10.0 at %, hot rolling properties also degrade and, furthermore, there is a concern that the ingot structure may become uneven. Therefore, the amount of Ca in the Cu—Ca-based alloy for the hot rolled plate made of copper alloy used for a sputtering target of the present invention is set to 0.5 to 10.0 at %.

Meanwhile, generally, the continuous casting of copper alloys is classified into semi-continuous casting in which the melting of raw materials to be melted is carried out in a batch-type melting furnace and only casting is continuously carried out as long as a certain length and complete continuous casting in which the melting of raw materials to be melted is also continuously carried out and casting is continuously carried out as long as, in principle, a limitless length. In the case of the semi-continuous casting, any copper alloys can be cast without any particular obstacle as long as the amount of Ca is up to approximately 10.0 at %; however, in the case of the complete continuous casting, when the amount of Ca exceeds 6.0 at %, the temperature of the molten metal is decreased during casting due to the continuous addition of a large amount of a material for adding Ca during melting and casting and there is a concern that casting may become difficult. Therefore, in the case of the complete continuous casting, the amount of Ca is desirably set to 6.0 at % or less and, furthermore, more preferably set to 4.0 at % or less. Meanwhile, generally, when the amount of Ca increases, there is a tendency that the grain sizes of Cu—Ca-based crystals that crystallize during casting increase; however, in a case in which the complete continuous casting or the semi-continuous casting is applied on a mass production scale, when the amount of Ca is 10.0 at % or less, as described again below, the grain sizes of Cu—Ca-based crystals that crystallize during casting can be decreased by appropriately controlling the solidification rate during casting and thus it is possible to adjust the average grain size of Cu-α phase crystal grains in a Cu matrix of the hot rolled plate to a certain size or less which is regulated in the present invention.

The hot rolled plate made of copper alloy used for a sputtering target of the present invention simply needs to be made of, basically, the above-described Cu—Ca-based alloy containing 0.5 to 10.0 at % of Ca and can be applied to all hot rolled plate made of Cu—Ca-based alloy that can be used as sputtering targets. That is, alloy elements that can be added as sputtering target materials may be added as necessary in addition to Ca. The typical elements thereof are Mg, Mn, Al, and P and, regarding these elements, the Cu—Ca-based alloy is allowed to contain a total of 10.0 at % or less of one or more selected from 0.1 to 5.0 at % of Mg, 0.1 to 5.0 at % of Mn, 0.1 to 5.0 at % of Al, and 0.001 to 0.1 at % of P. Here, selective addition elements that are added as necessary will be described.

Mg:

In a case in which sputtering is carried out using a target for which a hot rolled plate made of an alloy obtained by adding Mg to a Cu—Ca alloy is used and a TFT wiring film is formed, Mg improves the barrier properties of the wiring film to substrates and contributes to the improvement of adhesiveness to substrates. When the amount of Mg added is less than 0.1 at %, the effects cannot be sufficiently obtained and, when the amount of Mg added exceeds 5.0 at %, the resistivity of the wiring film becomes great, which makes the wiring film inappropriate as a TFT wiring film. Therefore, in a case in which Mg is added, the amount of Mg added is set in a range of 0.1 to 5.0 at %.

Mn:

In a case in which sputtering is carried out using a target for which a hot rolled plate made of an alloy obtained by adding Mn to a Cu—Ca alloy is used and a TFT wiring film is formed, Mn improves the adhesiveness and chemical stability of the wiring film to substrates when coexisting with Ca. When the amount of Mn added is less than 0.1 at %, the effects cannot be sufficiently obtained and, when the amount of Mn added exceeds 5.0 at %, the resistivity of the wiring film becomes great, which makes the wiring film inappropriate as a TFT wiring film. Therefore, in a case in which Mn is added, the amount of Mn added is set to be in a range of 0.1 to 5.0 at %.

Al:

In a case in which sputtering is carried out using a target for which a hot rolled plate made of an alloy obtained by adding Al to a Cu—Ca alloy is used and a TFT wiring film is formed, Al improves the adhesiveness and chemical stability of the wiring film to substrates when coexisting with Ca. When the amount of Al added is less than 0.1 at %, the effects cannot be sufficiently obtained and, when the amount of Al added exceeds 5.0 at %, the resistivity of the wiring film becomes great, which makes the wiring film inappropriate as a TFT wiring film. Therefore, in a case in which Al is added, the amount of Al added is set to be in a range of 0.1 to 5.0 at %.

P:

P is an addition element capable of improving casting properties without impairing the resistivity, adhesiveness, or the like of the TFT wiring film. When the amount of P added is less than 0.001 at %, the effects cannot be sufficiently obtained and, on the other hand, even when more than 0.1 at % of P is added, the casting properties cannot be further improved and the resistivity increases. Therefore, in a case in which P is added, the amount of P added is set to be in a range of 0.001 to 0.1 at %.

The lower limit values of the amounts of Mg, Mn, Al, and P added simply refer to the lower limit values in a case in which these elements are actively added and it is needless to say that the Cu—Ca-based alloy is allowed to contain the elements as impurities in small amounts that are less than the respective lower limit values.

In addition, the total amount of one or more of Mg, Mn, Al, and P is set to 10.0 at % or less. When the total amount exceeds 10.0 at %, the resistivity of the wiring film becomes excessive, which makes the wiring film inappropriate as a TFT wiring film.

The balance of the respective elements described above is basically Cu and inevitable impurities. Here, examples of the inevitable impurities include Fe, Si, Ag, S, O, C, H, and the like and the total amount of these inevitable impurities is desirably 0.3 at % or less. In addition, since the characteristics of the present invention are not affected as long as the total amount of Co, Cr, Be, Hg, B, Zr, and the like included is 0.3 at % or less, the Cu—Ca-based alloy is also allowed to contain 0.3 at % or less of the above-described elements in total.

In the present invention, for the hot rolled plate made of copper alloy used for a sputtering target made of an alloy having the above-described component composition, the grain size conditions regarding the Cu-α phase crystal grains in the Cu matrix are important.

That is, as described above, when the average grain size of the Cu-α phase crystal grains in the Cu matrix is appropriately restricted, it is possible to reliably and stably limit the occurrence of abnormal electrical discharge in a case in which sputtering is carried out using a target for which the hot rolled plate is used.

Here, when the average grain size of the Cu-α phase crystal grains in the Cu matrix exceeds 60 μm, as a whole, the fraction of coarse crystal grains increases and thus abnormal electrical discharge is likely to occur during sputtering.

On the other hand, when the average grain size of the Cu-α phase crystal grains is 60 μm or less, an effect that limits the occurrence of abnormal electrical discharge during sputtering can be obtained. When the average grain size is restricted to 40 μm or less, it becomes possible to more reliably limit the occurrence of abnormal electrical discharge. Meanwhile, in ordinary complete continuous casting or semi-continuous casting on a mass production scale, it is difficult to adjust the average grain size of the Cu-α phase crystal grains to less than 5 μm due to the relationship between the average grain size and the cooling rate during casting and thus an attempt to restrict the average grain size to less than 5 μm brings about a necessity of a special casting design and a special cooling design, which causes a significant increase in the cost.

Therefore, in the present invention, the average grain size of the Cu-α phase crystal grains in the Cu matrix is restricted in a range of 5 to 60 μm.

Here, the grain sizes of the Cu-α phase crystal grains in the Cu matrix were measured using a cutting method according to JIS H0501:1986 (methods for estimating average grain size of wrought copper and copper alloys, corresponding to ISO 2624-1973). In addition, an average grain size in a range of 5 to 60 μm means that the grain size which is the average value of the average grain sizes on three cross-sections in the hot rolled plate is in the above-described range, the three cross sections including: a cross-section parallel to a rolling surface; a cross-section orthogonal to the rolling surface and parallel to the rolling direction; and a cross-section orthogonal to the rolling surface and to the rolling direction, and the average grain size being obtained when an arbitrary section of, for example, 500 μm×700 μm, of each of the three above-described cross-sections is viewed and the grain sizes are measured.

Meanwhile, regarding the hot rolled plate used for a sputtering target, in the measurement of the grain sizes of the Cu-α phase crystal grains in the Cu matrix, the hot rolled plate can be considered as satisfying the average grain size regulated by the present invention as a whole, when the average grain size of the above-described views in three directions corresponding to the three cross-sections is within the range regulated by the present invention, the average grain size being obtained by, as described in examples below, taking measurement samples from portions corresponding to the centers in the rolling width direction and the thickness direction; and measuring grain sizes from the three directions.

Next, a method for producing the hot rolled plate made of copper alloy used for a sputtering target of the present invention will be described.

When the hot rolled plate made of copper alloy used for a sputtering target of the present invention is produced, basically, a Cu—Ca-based alloy having a predetermined component composition is melted and cast through continuous casting so as to produce an ingot, a homogenization treatment is carried out as necessary, and then hot rolling is carried out, thereby producing a hot rolled plate made of copper alloy used for a sputtering target having a predetermined plate thickness. When the obtained hot rolled plate is worked so as to have a predetermined shape and predetermined dimensions by carrying out appropriate mechanical working and the like, finally, a sputtering target can be obtained.

During casting, the ingot structure is made finer as the solidification rate is increased. The ingot structure also has an influence on recrystallization behaviors in the subsequent hot rolling step and, generally, as the ingot structure becomes finer, it becomes possible to easily make the recrystallized structure finer.

In addition, an increase in the solidification rate during casting is also advantageous to the formation of finer recrystallized grains during hot rolling through the miniaturization of crystals in the ingot. That is, Cu—Ca-based crystals that have crystallized during casting serve as starting points for the generation of recrystallization nuclei during recrystallization in the hot rolling step after casting, and also serve as resistance to the growth of recrystallized grains. Thus, the recrystallized structure is finer as crystals are smaller. Meanwhile, an excessively high temperature during hot rolling coarsens recrystallized grains, and therefore the temperature during hot rolling is also important.

From the above-described viewpoint, the solidification rate (the cooling rate during casting) is desirably set to be as high as possible even in a case in which the hot rolled plate made of copper alloy used for a sputtering target of the present invention is produced. In a case in which a hot rolled plate made of copper alloy used for a sputtering target of the present invention is produced on a mass production scale, continuous casting can be used as a method for obtaining a high solidification rate. Therefore, in the present invention as well, continuous casting is used. Among various types of continuous casting, complete continuous casting is preferably applied in terms of productivity.

Next, an example of a specific method for obtaining an ingot by applying continuous casting will be described with reference to FIG. 1 and, furthermore, a measure for stably increasing the solidification rate in the above-described case will be described.

In FIG. 1, a high-purity copper raw material such as electrolytic copper is melted in a melting furnace 1. The surface of the molten metal (molten copper) in the melting furnace 1 is sealed with carbon and the atmosphere in the melting furnace 1 is filled with an inert gas or a reducing gas. Molten copper 3 melted in the melting furnace 1 is continuously led to a tundish 7 through a launder 5 sealed with the inert gas or the reducing gas. Addition means 9 for adding an alloy element such as Ca is provided in the tundish 7 and the alloy element such as Ca is continuously added so as to produce a target component composition. The molten metal of a copper alloy (Cu—Ca-based alloy) having a component adjusted in the tundish 7 is continuously poured into a mold for continuous casting 13 through a pouring nozzle 11. An ingot 15 solidified in the mold for continuous casting 13 is continuously drawn using drawing means such as a pinch roll not shown.

In the above-described continuous casting, it is surely important to improve the cooling capability of the casting mold, for example, to increase the amount of cooling water in the casting mold, to increase the solidification rate of the ingot. However, as a result of experiments by the present inventors and the like, it has been clarified that a simple increase in the general cooling capability of the casting mold does not fully eliminate a concern that it may become difficult to uniformly make the ingot structure finer and miniaturize crystals in a reliable manner by uniformly increasing the solidification rate in an actual cast ingot. That is, immediately after the initiation of solidification in the casting mold, there are cases in which a phenomenon (so-called mold detachment) in which the surface of the ingot (the surface of a solidified shell) is detached from the inner surface of the mold due to solidification shrinkage, occurs. When the degree of the above-described mold detachment (the size of the gap between the inner surface of the casting mold and the surface of the ingot) becomes great, heat is not sufficiently dissipated from the surface of the ingot at a portion with a great degree of the mold detachment and thus the solidification rate becomes small. In addition, there are cases in which the above-described mold detachment becomes significantly intensified depending on the shape (the cross-sectional shape of the ingot to be cast) or cooling design of the casting mold.

Figure 2:
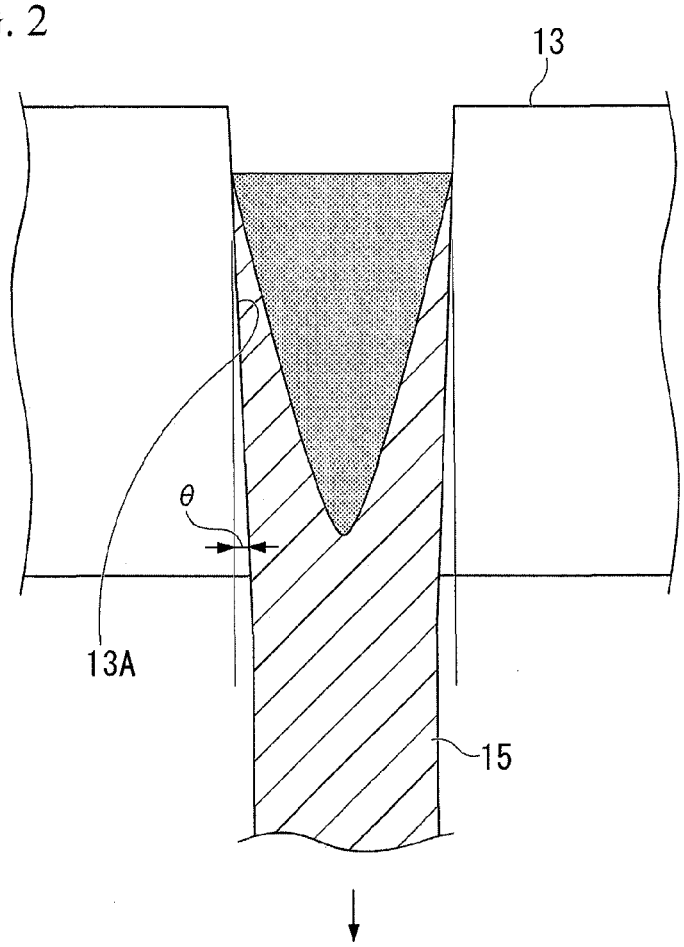
FIG. 2 is a schematic view showing a preferred casting mold configured to apply continuous casting to the casting of the Cu—Ca-based alloy material in the producing process of the hot rolled plate made of copper alloy used for a sputtering target of the present invention from a vertical cross-sectional position.

In addition, in the continuous casting, the taper (the inclined angle of the inner surface of the casting mold against the vertical surface) in the casting mold also has an influence on the mold detachment. That is, as the ingot is solidified and is drawn downward in the casting mold, the outer dimensions of the ingot decrease toward the bottom of the casting mold due to the solidification shrinkage of the ingot on both the short side and the long side. Thus, if there is no taper in the casting mold, the large mold detachment occurs in the lower portion in the casting mold, which also causes the solidification rate to be decreased. Therefore, the above-described problem can be avoided by imparting a taper with a predetermined angle $\theta$ to an inner surface 13A of the casting mold 13 as shown in FIG. 2. However, an excessively large taper angle $\theta$ increases the friction between the surface of the ingot and the inner surface of the casting mold, and thus there is a concern that the drawing of the ingot may become difficult. Accordingly, it is desirable to set an appropriate taper angle.

In the above-described casting phase, since Ca rarely forms solid solutions in the Cu matrix of the Cu—Ca-based alloy containing 0.5 to 10.0 at % of Ca, almost all the Ca crystallizes as Cu—Ca-based crystals represented by $Cu_5Ca$. Here, the solidification rate is uniformly increased by applying an appropriate cooling design for the casting mold and an appropriate casting mold shape as described above, and thus it is possible to make the ingot structure finer and prevent coarse crystals from being generated.

On the ingot obtained in the above-described manner, a homogenization treatment is carried out as necessary and then hot rolling is carried out, thereby producing a hot rolled plate made of copper alloy used for a sputtering target having a predetermined plate thickness. The conditions for the homogenization treatment and the hot rolling are not particularly limited and may be identical to those for a conventional hot rolled plate made of copper alloy used for a sputtering target. As the homogenization treatment, for example, the ingot may be heated at 650 to 900° C. for 1 to 4 hours. In addition, the hot rolling may be carried out at the recrystallization temperature or higher according to an ordinary method and, specifically, the hot rolling may be carried out, for example, at a rolling initiation temperature of 650 to 900° C., at a rolling end temperature of 500 to 600° C., and at a rolling ratio of 70 to 95%.

In the hot rolling step, recrystallization occurs and, as the ingot structure before recrystallization is finer, it is possible to easily make the recrystallized structure finer.

In addition, the Cu—Ca-based crystals in the ingot do not form solid solutions in the Cu matrix and almost all the crystals remain in the hot rolled plate. The crystals function as recrystallization nuclei during recrystallization in the hot rolling step and, furthermore, serve as resistance to the growth of recrystallized grains, whereby the coarsening of the recrystallized grains is prevented. Therefore, as the crystals in the ingot are smaller, the recrystallized structure is finer.

The finer ingot structure is formed and the crystals are miniaturized by applying continuous casting as a casting method and increasing the solidification rate during casting as described above, and thereby the formation of the finer recrystallized grains and the prevention of the coarsening of the recrystallized grains in the hot rolling step are easily achieved and the Cu-α phase crystal grains in the Cu matrix of the hot rolled plate are made finer. As a result, it becomes possible to make the average grain size of the Cu-α phase crystal grains be in the above-described range.

The hot rolled plate made of the Cu—Ca-based alloy obtained in the above-described manner is worked so as to have a predetermined shape and predetermined dimensions by carrying out appropriate mechanical working and the like, and thereby, a sputtering target can be obtained.

Hereinafter, both examples and comparative examples of the present invention will be described. Meanwhile, the examples described below are intended to describe the effects of the present invention and it is needless to say that constitutions, processes, and conditions described in the examples do not limit the technical scope of the present invention.

Examples

Electrolytic copper having a purity of 99.99 mass % was melted using a continuous casting device shown in FIG. 1 and Ca was added to the molten copper using addition means 9, thereby casting Cu—Ca-based alloys having the component compositions described for Nos. 1 to 9, which are invention examples, and No. 10, which is a comparative example, in Table 1. A cake-form ingot having a rectangular cross-section was used as the ingot, and the cross-sectional dimensions were set to 260 mm×640 mm. In addition, in casting, a carbon casting mold was used as the casting mold and the amount of cooling water was set to 2,500 liters/minute. In addition, the tapers of the casting mold were set to 0.4° for the long side and 0.4° for the short side. The drawing rate was set to approximately 9 cm/min.

The cast continuous casting ingot was divided into 950 mm-long segments; the segments were heated for 2 hours at the hot rolling initiation temperatures described in Table 1 using a batch-type heating furnace; hot rolling was initiated; the segments were rolled to a plate thickness of 22 mm; and then the segments were water-quenched, thereby producing hot rolled plates made of copper alloy used for a sputtering target. The hot rolling end temperature was set to 550° C.

The surface of a plate material cut out from each of the obtained hot rolled plates was turned, thereby producing a sputtering target having dimensions of an outer diameter of 200 mm×a thickness of 10 mm.

In addition, a sputtering target having dimensions of an outer diameter of 200 mm×a thickness of 10 mm was produced as a conventional example to which batch-type casting was applied, by: preparing oxygen-free copper having a purity of 99.99 mass %; melting the oxygen-free copper using a high frequency in a high-purity graphite mold in an Ar gas atmosphere; adding and dissolving Ca in the obtained molten metal; adjusting the components so as to produce molten metal having a component composition described for No. 11 in Table 1; casting the obtained molten metal in a cooled carbon casting mold; hot rolling the cast metal so as to produce a hot rolled plate; subjecting the hot rolled plate to strain-relief anneal; and then turning the surface thereof.

Figure 3:
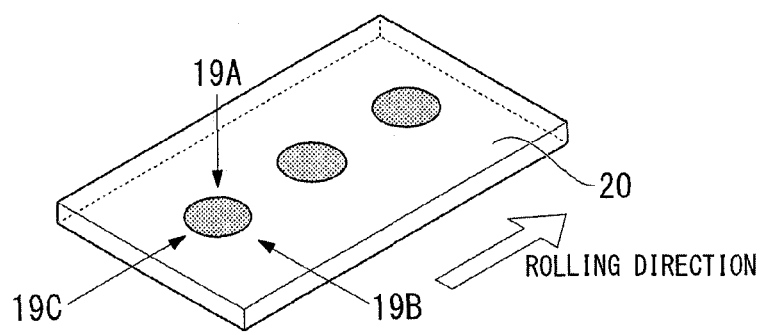
FIG. 3 is a schematically exploded view of a hot rolled plate made of Cu—Ca-based alloy showing positions from which samples used to measure the grain sizes of Cu-α phase crystal grains in a Cu matrix are taken in examples of the present invention.

In the above-described process, samples for observing the crystal grain sizes were taken from the respective hot rolled plates. The samples were taken from portions corresponding to the centers in the rolling width direction and the thickness direction of three positions 20 including the front end, the middle portion, and the rear end in the hot rolled plate as shown in FIG. 3. Cu-α phase crystal grains in a Cu matrix were observed from three directions 19A, 19B, and 19C which corresponded to three cross-sections including: a cross-section parallel to a rolling surface; a cross-section orthogonal to the rolling surface and parallel to the rolling direction; and a cross-section orthogonal to the rolling surface and orthogonal to the rolling direction, and the average grain size of the Cu-α phase crystal grains was measured using a cutting method according to JIS H0501: 1986 (methods for estimating average grain size of wrought copper and copper alloys, corresponding to ISO 2624-1973).

The average grain sizes of the Cu-α phase crystal grains in the Cu matrixes of the samples from the respective hot rolled plates of Nos. 1 to 11 are described in Table 1.

Meanwhile, the sputtering targets made of the hot rolled plates of the respective alloys of Nos. 1 to 11 obtained in the above-described manner were soldered on an oxygen-free copper backing plate with being overlaid thereon, thereby producing backing plate-attached targets.

The respective targets were mounted in a sputtering device and continuous sputtering was carried out under the following conditions. Meanwhile, the sputtering was carried out in two types of atmosphere (an Ar gas atmosphere and an Ar—$O_2$ mixed gas atmosphere) with an assumption of sputtering in different atmospheres.

Power source: Direct current system

Sputtering output: 600 W

Peak vacuum degree: $4 \times 10^{-5}$ Pa

Atmosphere gas composition: two types including: Ar gas; and a mixed gas of 90 volume % of Ar and 10 volume % of oxygen (Ar gas: sputtering for wiring films, mixed gas: sputtering for oxygen-containing film)

Sputtering pressure: 0.2 Pa

Sputtering time: 8 hours

The total number of times of abnormal electrical discharge was counted using an arcing counter equipped with a power source between the continuous sputtering steps. The results are described in Table 1.

TABLE 1

| | No. | Composition (at %) | | | | | | Hot rolling initiation temperature (°C.) | Cu-α phase crystal grain size (μm) Average | Abnormal electrical discharge | |
|---|---|---|---|---|---|---|---|---|---|---|---|
| | | Ca | Mg | Mn | Al | P | Cu | | | Ar gas | Mixed gas |
| Invention Examples | 1 | 0.6 | — | — | — | — | Balance | 778 | 22 | 0 | 1 |
| | 2 | 1.0 | — | — | — | — | Balance | 769 | 20 | 0 | 1 |
| | 3 | 3.2 | — | — | — | — | Balance | 767 | 18 | 2 | 2 |
| | 4 | 1.3 | — | — | — | — | Balance | 665 | 7 | 0 | 1 |
| | 5 | 1.5 | 1.1 | — | — | — | Balance | 782 | 18 | 3 | 4 |
| | 6 | 1.6 | — | 1.0 | — | — | Balance | 771 | 18 | 2 | 3 |
| | 7 | 1.5 | — | — | 0.9 | — | Balance | 760 | 19 | 2 | 3 |
| | 8 | 1.5 | 0.8 | 0.6 | 0.6 | 0.05 | Balance | 775 | 17 | 3 | 2 |
| | 9 | 5.8 | — | — | — | — | Balance | 892 | 58 | 5 | 6 |
| Comparative Examples | 10 | 1.7 | — | — | — | — | Balance | 945 | 80 | 15 | 13 |
| Conventional Examples | 11 | 2.1 | — | — | — | — | Balance | 785 | 115 | 23 | 28 |

In Table 1, Nos. 1 to 9 are invention examples in which the average grain size of the Cu-α phase crystal grains was 5 to 60 μm.

On the other hand, No. 10 is a comparative example in which the average grain size of the Cu-α phase crystal grains exceeded 60 μm.

Furthermore, No. 11 is a conventional example produced by applying batch-type casting, in which the average grain size of the Cu-α phase crystal grains significantly exceeded 60 μm.

As is clear from Table 1, it was confirmed that, in the invention examples of Nos. 1 to 9 in which the average grain size of the Cu-α phase crystal grains was 5 to 60 μm, the numbers of times of abnormal electrical discharge were all as small as 6 or less.

On the other hand, in the comparative example of No. 10 and the conventional example of No. 11 in which the average grain size of the Cu-α phase crystal grains exceeded 60 μm, the numbers of times of abnormal electrical discharge were all 13 or more, which indicated that abnormal electrical discharge frequently occurred.

INDUSTRIAL APPLICABILITY

According to the present invention, it becomes possible to form a wiring film which has a low resistivity and stable and excellent adhesiveness to substrates and thus it becomes possible to manufacture large and high-definition TFT panels.

REFERENCE SIGNS LIST

1 MELTING FURNACE
3 MOLTEN COPPER
7 TUNDISH
13 CASTING MOLD
15 INGOT

The invention claimed is:

1. A hot rolled plate for a sputtering target, said hot rolled plate comprising:
    a copper alloy, wherein
    the copper alloy contains 0.5 to 10.0 at % of Ca and the balance consisting of Cu and inevitable impurities,
    an average grain size of Cu-α phase crystal grains is 5 to 60 μm in a Cu matrix, and
    Cu—Ca-based crystals are dispersed in the Cu matrix.

2. The hot rolled plate for a sputtering target according to claim 1,
    wherein an amount of Ca in the copper alloy is 0.5 to 6.0 at %.

3. The hot rolled plate for a sputtering target according to claim 1,
    wherein the copper alloy further contains a total of 10.0 at % or less of one or more elements selected from the group consisting of: 0.1 to 5.0 at % of Mg, 0.1 to 5.0 at % of Mn, 0.1 to 5.0 at % of Al, and 0.001 to 0.1 at % of P.

4. A sputtering target made of the hot rolled plate according to claim 1.

5. The hot rolled plate for a sputtering target according to claim 2,
    wherein the copper alloy further contains a total of 10.0 at % or less of one or more elements selected from the group consisting of: 0.1 to 5.0 at % of Mg, 0.1 to 5.0 at % of Mn, 0.1 to 5.0 at % of Al, and 0.001 to 0.1 at % of P.

6. A sputtering target made of the hot rolled plate according to claim 2.

7. A sputtering target made of the hot rolled plate according to claim 3.

8. A sputtering target made of the hot rolled according to claim 5.

* * * * *